US006555746B2

(12) United States Patent  (10) Patent No.: US 6,555,746 B2
Boyd et al.  (45) Date of Patent: Apr. 29, 2003

(54) HORIZONTAL COMPONENT RETENTION SOCKET

(75) Inventors: Patrick D. Boyd, Aloha, OR (US); Al LaValle, Beaverton, OR (US); Jarett L. Rinaldi, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/939,115

(22) Filed: Aug. 24, 2001

(65) Prior Publication Data

US 2003/0037946 A1 Feb. 27, 2003

(51) Int. Cl.[7] .................................. H02G 3/08
(52) U.S. Cl. .................. 174/50; 174/135; 174/52.1; 439/596; 439/56
(58) Field of Search .................. 174/50, 52.1, 52.4, 174/54, 58, 61, 64, 135, 68.3, 251, 255, 49; 439/596, 893, 930, 79, 80, 56, 356, 698; 385/134, 135

(56) References Cited

U.S. PATENT DOCUMENTS

| 4,065,198 | A | * | 12/1977 | Jordan ........................ 439/56 |
| 4,195,330 | A | * | 3/1980 | Savage, Jr. ................ 362/226 |
| 4,447,105 | A | * | 5/1984 | Ruehl ....................... 174/52.1 |
| 4,667,270 | A | * | 5/1987 | Yagi .......................... 439/356 |
| 4,682,829 | A | * | 7/1987 | Kunkle et al. ................ 439/70 |
| 5,116,229 | A | * | 5/1992 | Savage, Jr. ................... 439/56 |
| 5,121,311 | A | * | 6/1992 | Cheselske .................... 439/56 |
| 5,204,498 | A | * | 4/1993 | Russell ...................... 174/52.1 |
| 5,469,893 | A | * | 11/1995 | Caveney et al. ............ 174/68.3 |
| 5,704,797 | A | * | 1/1998 | Meyerhoefer et al. ...... 439/676 |
| 5,707,249 | A | * | 1/1998 | Byrd .......................... 439/56 |
| 5,709,554 | A | * | 1/1998 | Savage, Jr. ................... 439/56 |
| 5,798,910 | A | * | 8/1998 | Holbeche et al. ......... 174/50.51 |
| 6,002,089 | A | * | 12/1999 | Hemingway et al. ......... 174/97 |
| 6,037,543 | A | * | 3/2000 | Nicoli et al. .................. 174/49 |
| 6,231,370 | B1 | * | 5/2001 | Morin et al. ................ 439/698 |
| 6,363,198 | B1 | * | 3/2002 | Braga et al. ................ 385/134 |

* cited by examiner

Primary Examiner—Dean A. Reichard
Assistant Examiner—Angel R. Estrada
(74) Attorney, Agent, or Firm—Robert G. Winkee

(57) ABSTRACT

An apparatus and methods for attaching a component to a substrate, which allows through-hole mount electronic components to be attached to the substrate in a stabilized, horizontal orientation, without requiring prior lead preparation (e.g., bending). The apparatus is, in general, a socket including a housing having a first surface, a second surface, and an attachment surface. A recess is defined within the housing, wherein the recess comprises a component chamber extending from the housing first surface to a horizontal portion of at least one lead guide channel that extends from the component chamber to the housing second surface. The lead guide channel includes a sloped wall extending from the component chamber toward the lead guide channel. A lid is attached to the housing and adapted to move from an open position to a closed position abutting the housing second surface.

25 Claims, 8 Drawing Sheets

HORIZONTAL COMPONENT RETENTION SOCKET

BACKGROUND OF THE INVENTION

1. Field of the Invention

The present invention relates to apparatus and methods for attaching a component to a substrate. In particular, the present invention relates to a horizontal socket for attaching an electronic component to a substrate.

2. State of the Art

In the fabrication of electronic devices, a variety of electronic components may be utilized. A number of these electronic components may be mounted to a substrate, which is used in the fabrication of the electronic device. Some of these electronic components are "through-hole mount" (THM) components, wherein leads of the electronic components extend through and are attached to the substrate. The electronic components may be active or passive, and may include, but are not limited to, crystals, oscillators capacitors, diodes, resistors, and inductors. Within this application, the term "substrate" is defined to include motherboards, peripheral cards, cartridges, multi-chip module substrates, non-printed circuit board products, and similar structures, as will be evident to one skilled in the art.

FIG. 13 illustrates an electronic component 202 having a component body 204 and a pair of leads 206 extending therefrom. Generally, as shown in FIG. 14, such electronic components 202 are attached to a substrate 208 by forming plated vias 212, as known in the art, through the substrate 208, wherein the plated vias 212 are attached to traces (not shown) that make contact with other electrical components (not shown). The leads 206 of the electronic component 202 are inserted into the plated vias 212, such that they penetrate through the substrate 208. The component leads 206 are bent such that the component body 204 resides against the substrate 208. The component leads 206 may be bent prior to or after insertion into the plated vias 212. The component leads 206 are attached to the plated vias 212 using solder 214 applied by a wave solder process, as known in the art. The component body 204 may be secondarily attached to the substrate with an adhesive (not shown) and/or with a wire 218 (which encompasses the component body 204 and extends through the substrate 208). The wave soldering of the component leads 206 also secures the wire 218. It is, of course, understood that the secondary attachment is merely optional.

Another variation (not shown), as is known in the art, is for the component leads to be fashioned such that a portion of each component lead lies in contact with the substrate when the electronic component is surface mounted to the substrate. However, as will be known to one skilled in the art, these components are difficult to attach to the substrate due to their non-symmetrical configuration which requires placement offsets, due to the fragility of the component leads, and/or due to the round package configuration which may require special vacuum nozzles on the "pick and place" assembly equipment.

However, regardless of the configuration, the process of bending the component leads 206 results in substantial stresses on the seals (not shown) through which the component leads 206 enter the component body 204. These stresses may result in the fracturing of the seals, which can result in moisture infiltration that can have a performance impact, damage, or even destroy the electronic component 202. Furthermore, improper installation of the electronic component 202 may result in crossed component leads 206 that may render the electronic component 202 inoperable. Moreover, bending the component leads 206 requires additional fabrication step and costs to the process.

It is also known in the art that electronic components can be placed in a housing 222 to protect the electronic components, as shown in FIG. 15. These electronic component housings 222 may include a chamber 224 for receiving the electronic component and channels 226 for receiving electronic component leads 228. Such electronic component housings 222 may be obtained from Chicago Miniature Lamp, Inc. of Hackensack, N.J., USA.

Therefore, it would be advantageous to develop apparatus and techniques to effectively attach an electronic component to a substrate, which lessens or eliminates the problems discussed above.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings for which:

DETAILED DESCRIPTION OF THE ILLUSTRATED EMBODIMENT

Figure 1:
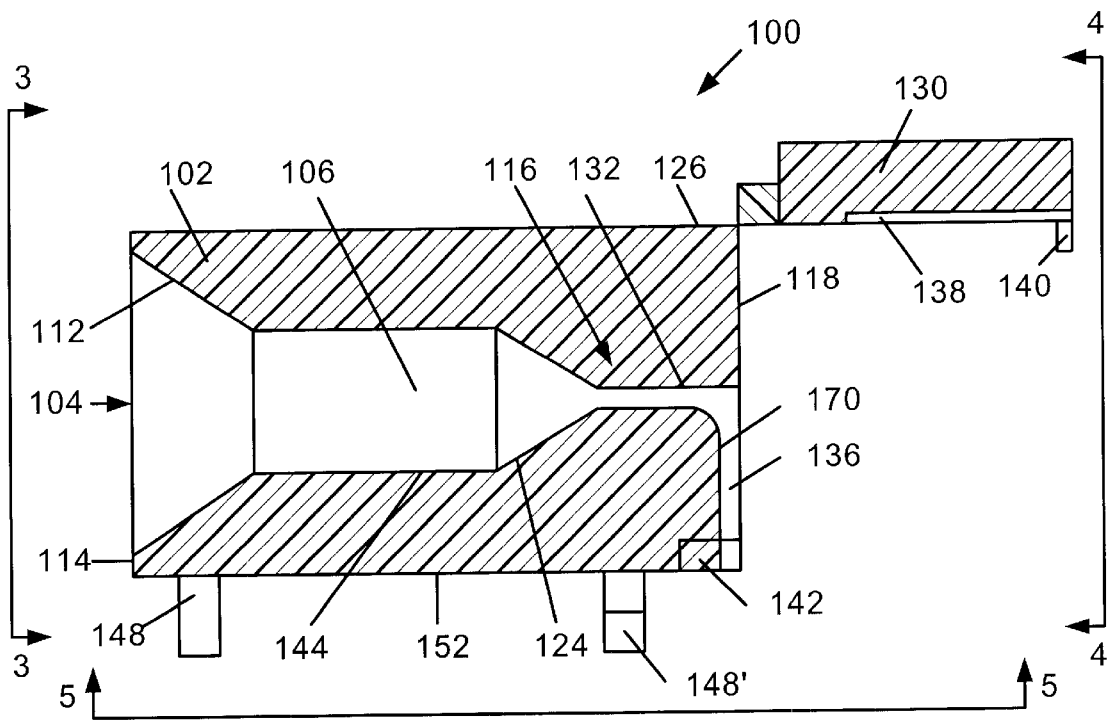
FIG. 1 is a side cross-sectional view of an embodiment of a horizontal component retention socket in an open position, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implement within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention comprises a component retention socket which allows through-hole mount (THM) electronic components to be attached to a substrate, such as a motherboard, in a stabilized, horizontal orientation, without requiring lead preparation (cutting, forming, etc.). The present invention may be used in any product or design location where height restrictions preclude use of a vertically oriented component (i.e., routers, switches, handheld devices, mobile computer platforms, and the like). Furthermore, the present invention substantially reduces the risk of handling related damage to component throughout assembly process and post-assembly. The component retention socket protects component from damage due to shock and vibration, and/or incidental contact.

FIGS. 1–8 illustrate a component retention socket 100 of the present invention comprising a housing 102 and a recess 104 formed therein. The socket recess 104 may comprise a component chamber 106 and a beveled guide 112 extending from a first surface 114 of the socket housing 102 to the component chamber 106. The socket recess 104 further comprises at least one lead guide channel 116 (shown as two lead guide channels 116 and 116' in FIGS. 3 and 4) extending from the component chamber 106 to a second surface 118 of the socket housing 102. The lead guide channels 116 and 116' include sloped walls 124 and 124' extending from the component chamber 106. The sloped walls 124 and 124' preferably slope to a point approximately one-quarter to one-third the distance from the component chamber 106 to the housing second surface 118.

Figure 2:
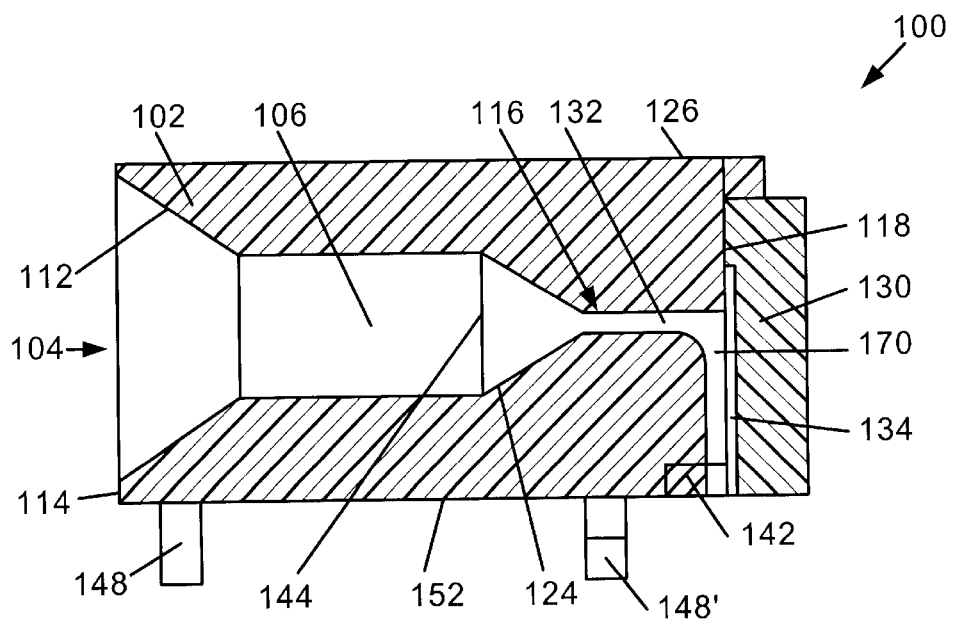
FIG. 2 is aside cross-sectional view of the horizontal component retention socket of FIG. 1 in a closed position, according to the present invention.
Figure 4:
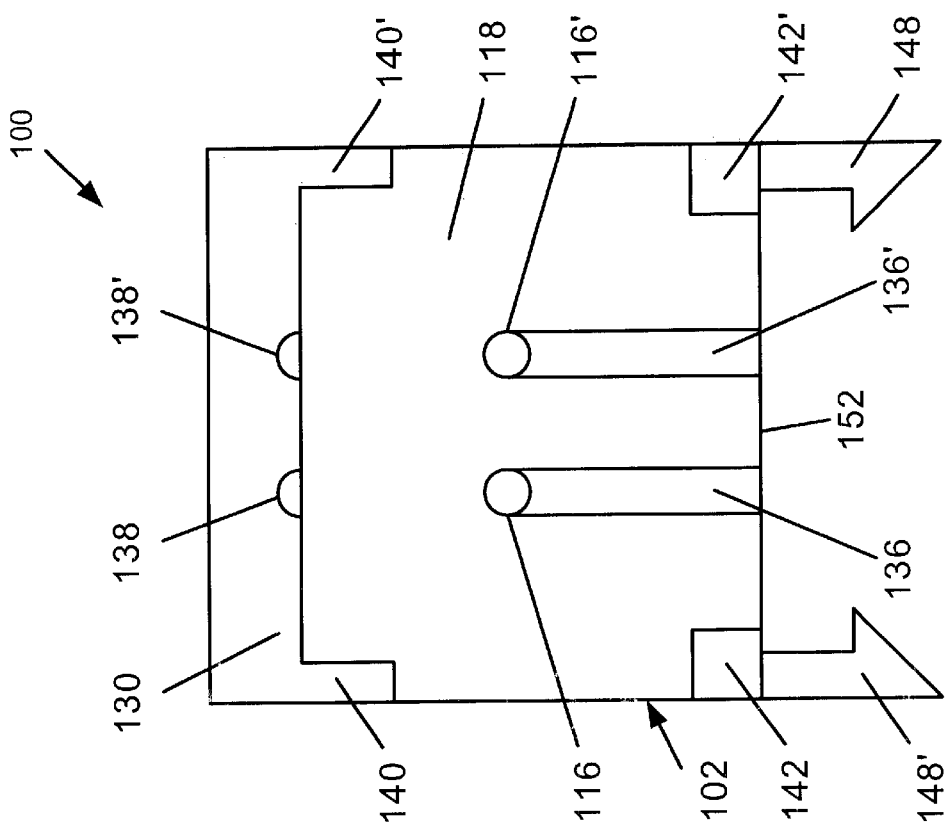
FIG. 4 is a side plan view of the horizontal component retention socket along lines 4—4 of FIG. 1, according to the present invention.
Figure 3:
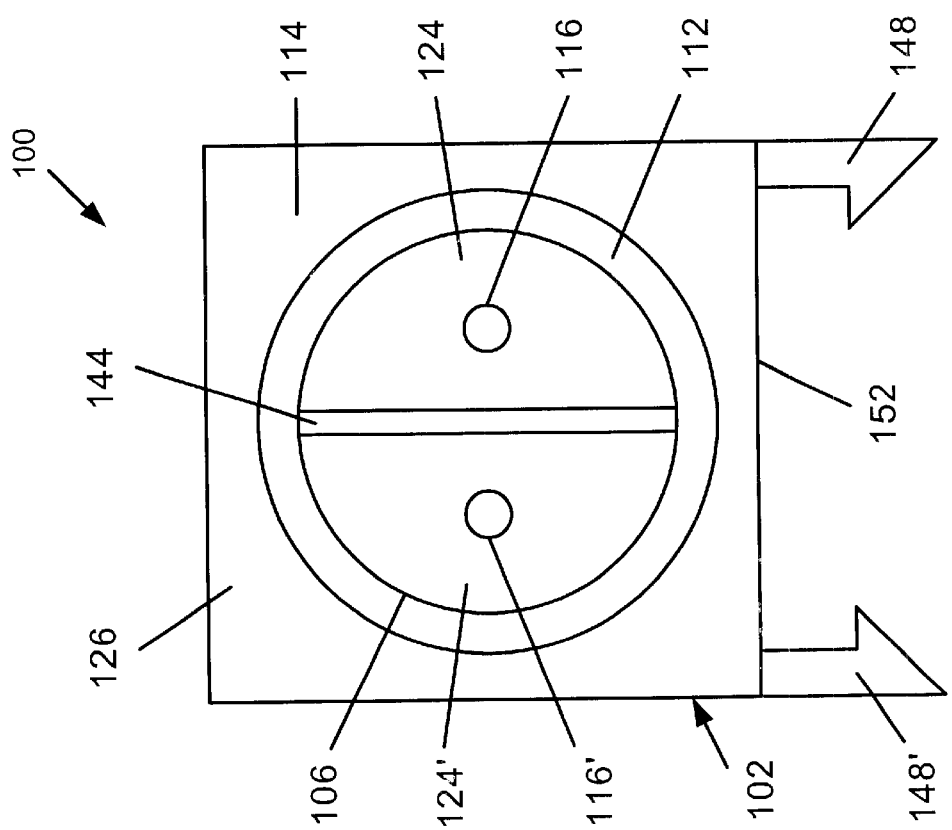
FIG. 3 is a side plan view of the horizontal component retention socket along lines 3—3 of FIG. 1, according to the present invention.
Figure 5:
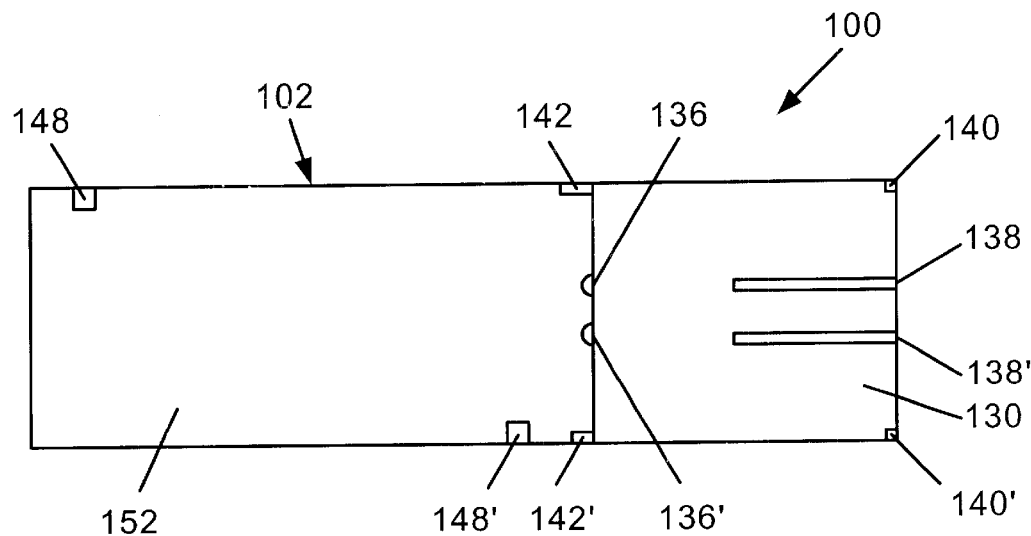
FIG. 5 is a bottom plan view of the horizontal component retention socket along lines 5—5 of FIG. 1, according to the present invention.

The component retention socket 100 further includes a lid 130 movably attached, by any means known in the art, to the socket housing 102 proximate an upper surface 126 thereof, such that the lid 130 may be moved between an open position shown in FIG. 1 and a closed position shown in FIG. 2. Each lead guide channel 116 includes a horizontal portion 132 and a vertical portion 134. The lead guide channel horizontal portion 132 is preferably substantially perpendicular to said lead guide channel vertical portion 134. Preferably, the lead guide channel vertical portion 134 is formed with approximately one half of a channel 136 (also channel 136' in FIGS. 4 and 5) in the socket housing 102 and approximately one half of a corresponding channel 138 (also channel 138' in FIGS. 4 and 5) in the lid 132. Thus, when the lid 130 is in the closed position shown in FIG. 2, the lead guide channel vertical portion 134 is formed. The lid 130 may include at least one attachment mechanism 140 (shown as elements 140 and 140'), which secure to at least one attachment mechanism 142 on the socket housing 102 (shown as elements 142 and 142') when the lid 130 in a closed position, as shown in FIG. 2.

The socket housing 102 should be constructed of an electrically non-conductive material, including polycarbonate materials, plastics, epoxy resins, nylons, and the like. The material used to construct the socket housing 102 should have sufficient hardness such that the component leads 164 (see FIG. 6) cannot penetrate into the socket housing 102 during the insertion of an electronic component 162 (see FIG. 6). The component retention socket 100 may be fabricated using an injection mold process, milling, or other such fabrication process as will be evident to those skilled in the art. Further, the component retention socket 100 may be formed as a single unit, but the present invention is not so limited. The outside of the socket housing 102 should be shaped such that it can be easily and securely held by human hand during the assembly onto a substrate, as will be later discussed, but could be alternately shaped for placement or handling by a tool or other such implement.

When more than one lead guide channel 116 is present, at least one lead separator 144 may be positioned between each lead guide channel 116 (shown positioned between lead guide channels 116 and 116'). The lead separator 144 separates leads of a component to be inserted (see FIG. 6) into their respective guide channels 116 and 116', which prevents electrical shorts due to leads coming into contact with each other.

The component retention socket 100 may include at least one substrate attachment mechanism 148 (shown as elements 148 and 148') extending from an attachment surface 152. The substrate attachment mechanisms 148, 148' are illustrated as hook clip mechanisms. Of course, the substrate attachment mechanisms 148, 148' may be any mechanisms known in the art, including but not limited to solderable posts, split pegs, threaded posts and nuts, as well as adhesive layers and surface mounts. The substrate attachment mechanisms 148, 148' may be an integral part of the socket. housing 102 (formed at the time of molding thereof). The substrate attachment mechanisms 148, 148' are preferably designed to extend through a substrate to which the component retention socket 100 is attached to provide a robust attachment to the substrate. Additionally, they should preferably be of sufficient thickness and durability to resist shearing (i.e., disassociation from the socket housing), fracture, or deformation from shock, vibration, and/or incidental contact. The substrate attachment mechanisms 148, 148' preferably allow removal of the component retention socket 100 from the substrate with a reasonable amount of effort, and without rendering the component retention socket 100 unusable.

Figure 6:
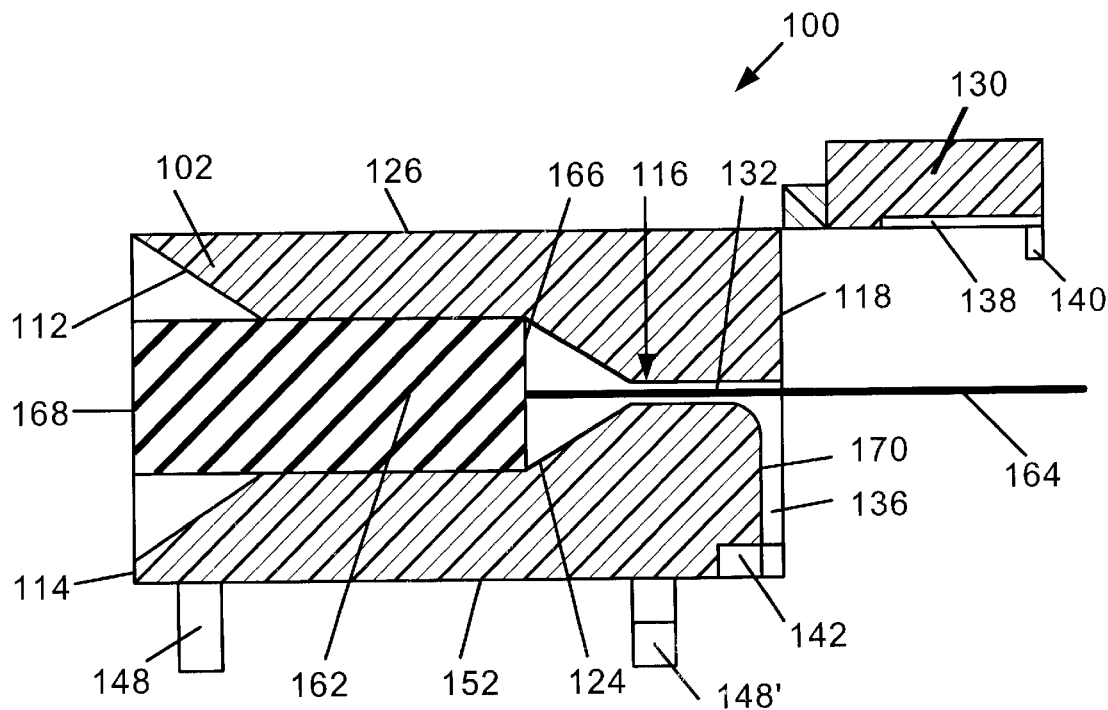
FIG. 6 is a side cross-sectional view of the horizontal component retention socket of FIG. 1 in an open position and having an electronic component disposed therein, according to the present invention.
Figure 7:
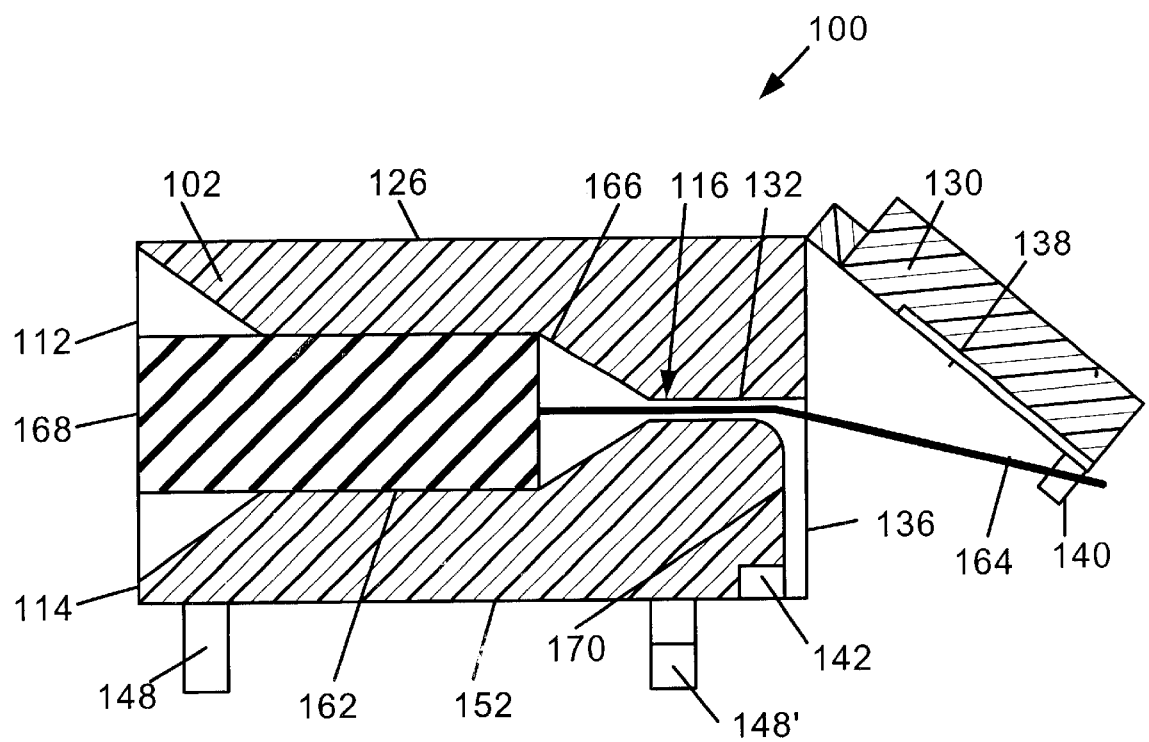
FIG. 7 is a side cross-sectional view of the horizontal component retention socket of FIG. 1 in a partially closed position and having an electronic component disposed therein, according to the present invention.

FIG. 6 illustrates the component retention socket 100 of FIG. 1 having an electronic component 162 horizontally oriented therein. The electronic component 162 may be active or passive, and may include, but are not limited to, crystals, oscillators, capacitors, diodes, resistors, and inductors. At least one lead 164 extends from a first surface 166 of an electronic component 162 through lead guide channel 116.

The component chamber 106 is, preferably, designed to closely conform to the length, width, height, and/or diameter of an electronic component 162. The dimensions should allow for the easy insertion of the electronic component 162, but limit movement of the electronic component 162 inside the component chamber 106 to the minimum degree possible.

The beveled guide 112 tapers into the component chamber 106 (i.e., wider proximate the socket housing first surface 114 than it is proximate the component chamber 106) to facilitate the insertion of the electronic component 162. The beveled guide 112 preferably terminates at a point no greater than about one-third of the electronic component length from the socket housing first surface 114. The beveled guide 112 should preferably provide sufficient clearance to allow entry of an implement, such as a tweezers, to grasp the electronic component 162 for removal. The sloped walls 124 and 124' and/or the lead separator 144 provide a stopping point for component insertion, such that a second surface 168 of the electronic component 162 is typically, but not necessarily, "flush" with the socket housing first surface 114.

Figure 8:
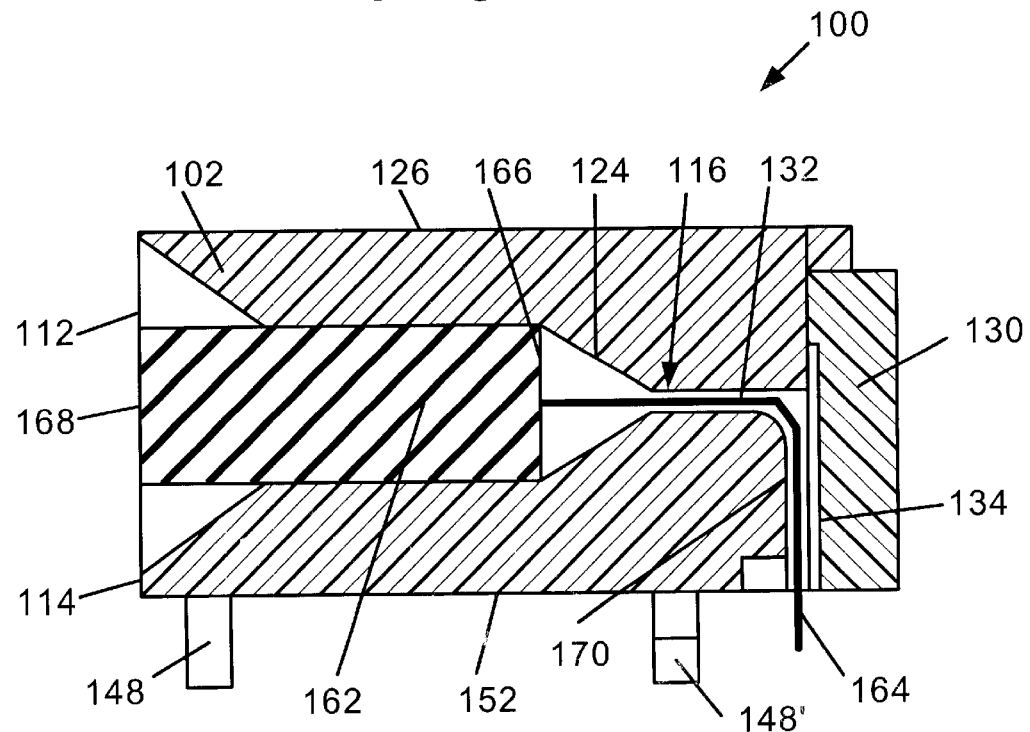
FIG. 8 is a side cross-sectional view of the horizontal component retention socket of FIG. 1 in a closed position and having an electronic component disposed therein, according to the present invention.

As shown in FIG. 6, the lead(s) 164 extend through the lead guide channel horizontal portion 132 and past the socket housing second surface 118. As the lid 130 is moved from an open position toward a closed position shown in FIG. 7, the lead 164 contacts the lid channel 138 and bends to conform to the radius of a structure 170 within the lead channel guide 116. In the closed position as shown in FIG. 8, a portion of the lead 164 conforms to the lead guide channel vertical portion 134 and extends perpendicularly from the socket housing attachment surface 152. The lead(s) 164 are thus positioned for insertion into vias (not shown) in a substrate (not shown) and attached thereto with solder. The socket housing attachment surface 152 is preferably substantially flat and preferably consumes a minimum amount of substrate surface area necessary to provide stability from the time of placement until the lead(s) 164 are soldered into place.

The separation of the centers of the lead guide channel vertical portions 134 are preferably spaced to avoid solder bridging during manufacturing. The lead guide channels 116, 116' preferably maintain a uniform dimension from the termination of the sloped wall 124, 124' through the lead guide channel horizontal portion 132. Furthermore, the lead guide channels 116, 116' should be sized to prevent the electronic component leads 164 and 164' (not shown) from binding during insertion, but not large enough to allow entry of more than a single lead.

This design allows the lead(s) 164 to be bent without passing any significant stresses to the electronic component 162 and, with a sufficient radius of the structure 170, the likelihood of lead breakage is greatly reduced. This allows for bending the component lead(s) 164 without the use of additional tooling, while virtually eliminating assembler-induced defects. Furthermore, it is simpler (i.e., fewer manufacturing operations) and more repeatable manufacturing process by controlling component lead 164 penetration through the substrate. Moreover, the component retention socket 100 reduces susceptibility of the electronic component 162 to damage due to shock, vibration, or incidental contact, both during and after assembly.

Figure 9:
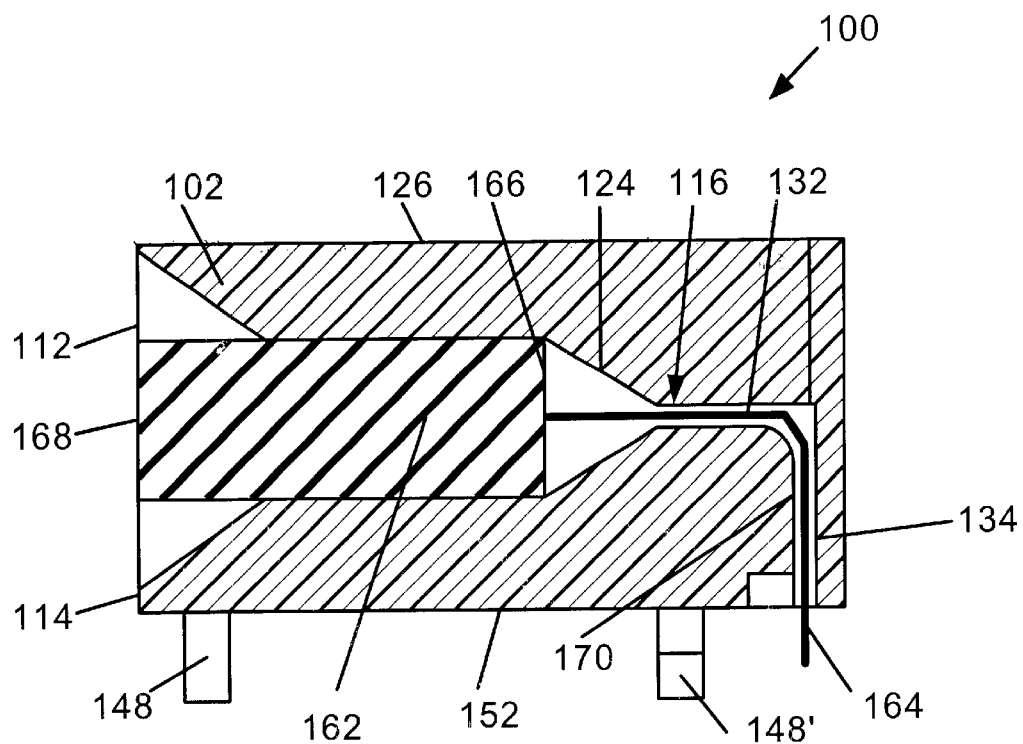
FIG. 9 is a side cross-sectional view of another embodiment of a horizontal component retention socket in an open position, according to the present invention.

As shown in FIG. 9, the lid 130 is optional. If the lead 164 is sufficiently complaint, the lead 164 may simply bend to conform to the lead guide channel horizontal portion 132 and the lead guide channel vertical portion 134 during the insertion of the electronic component 162 into the component retention socket 100.

Figure 10:
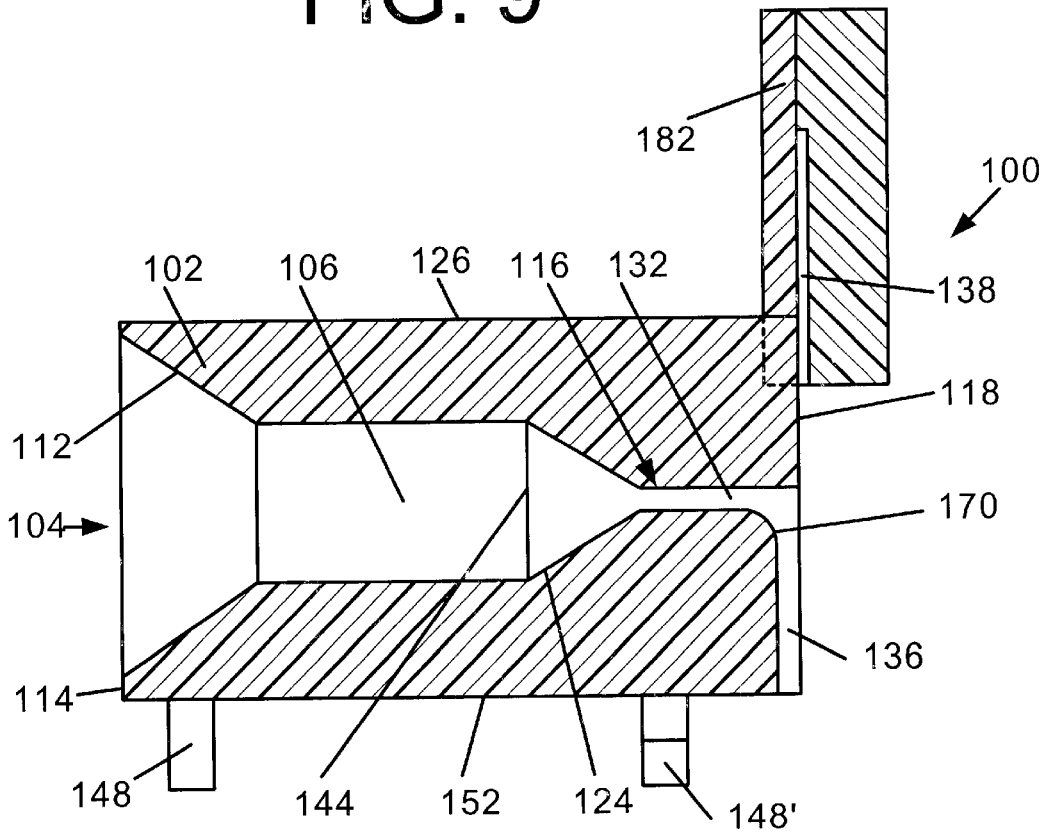
FIG. 10 is a side cross-sectional view of another embodiment of a horizontal component retention socket in an open position, according to the present invention.
Figure 11:
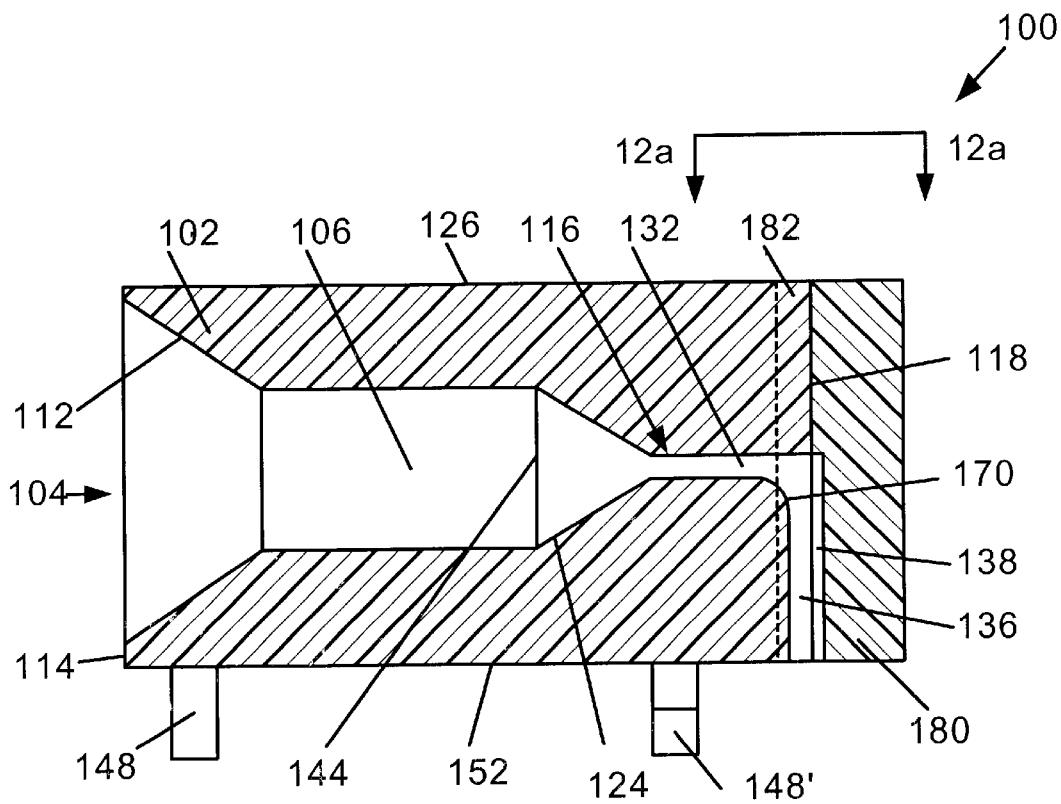
FIG. 11 is a side cross-sectional view of the horizontal component retention socket of FIG. 10 in a closed position, according to the present invention.
Figure 12A:
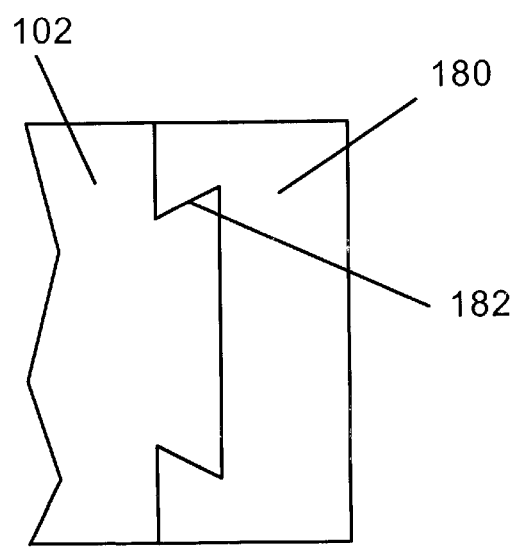
FIG. 12a is a top plan view of the slidable attachment mechanism along lines 12a—12a of FIG. 11 according to the present invention.
Figure 12B:
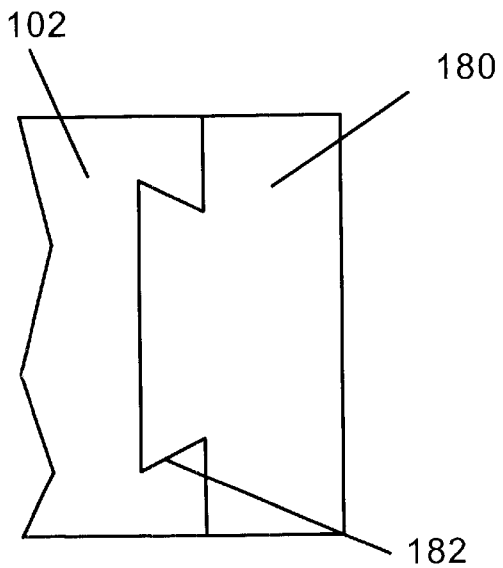
FIG. 12b is a top plan view of another slidable attachment mechanism according to the present invention.
Figure 13:
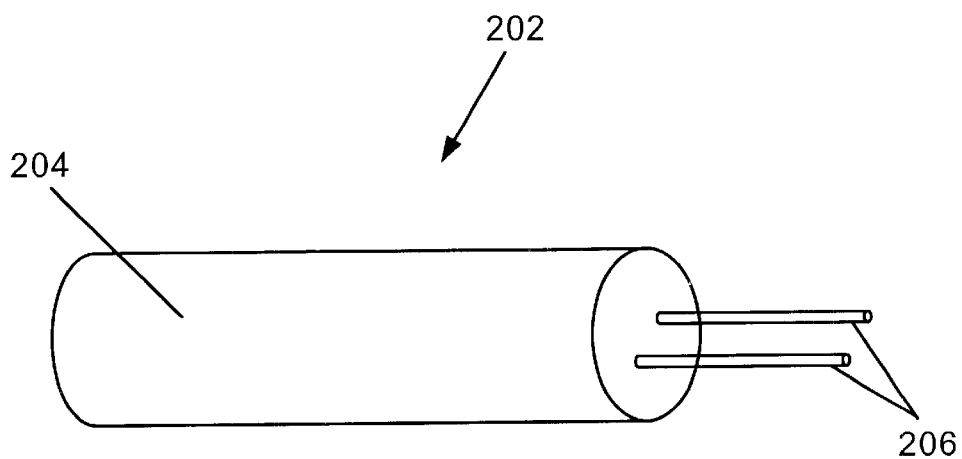
FIG. 13 is an oblique view of an electronic component, as known in the art.
Figure 14:
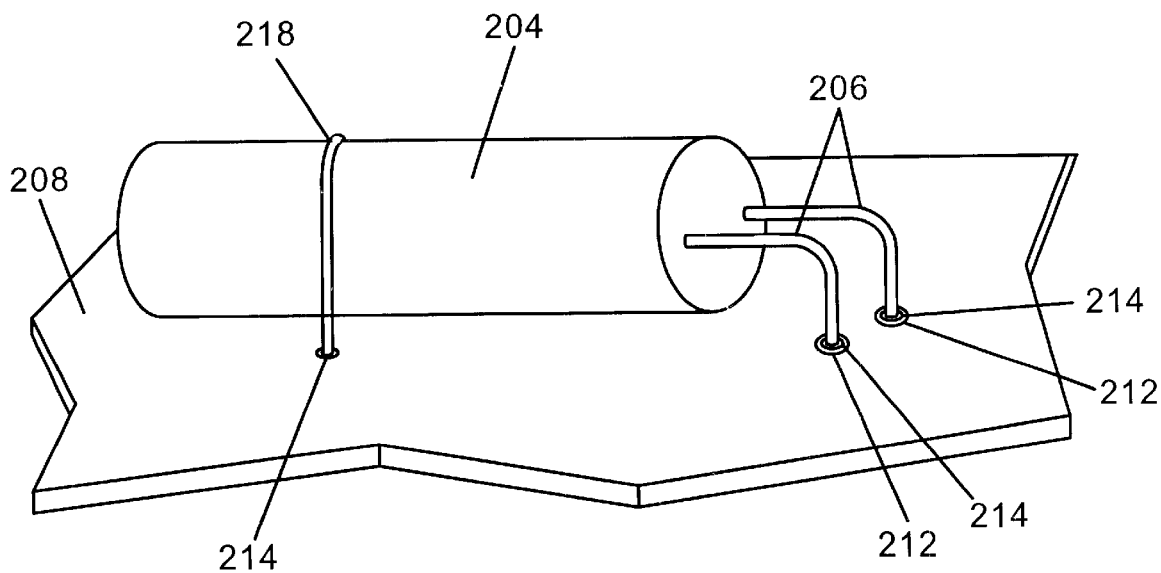
FIG. 14 is an oblique view of an electronic component attached to a substrate, as known in the art.
Figure 15:
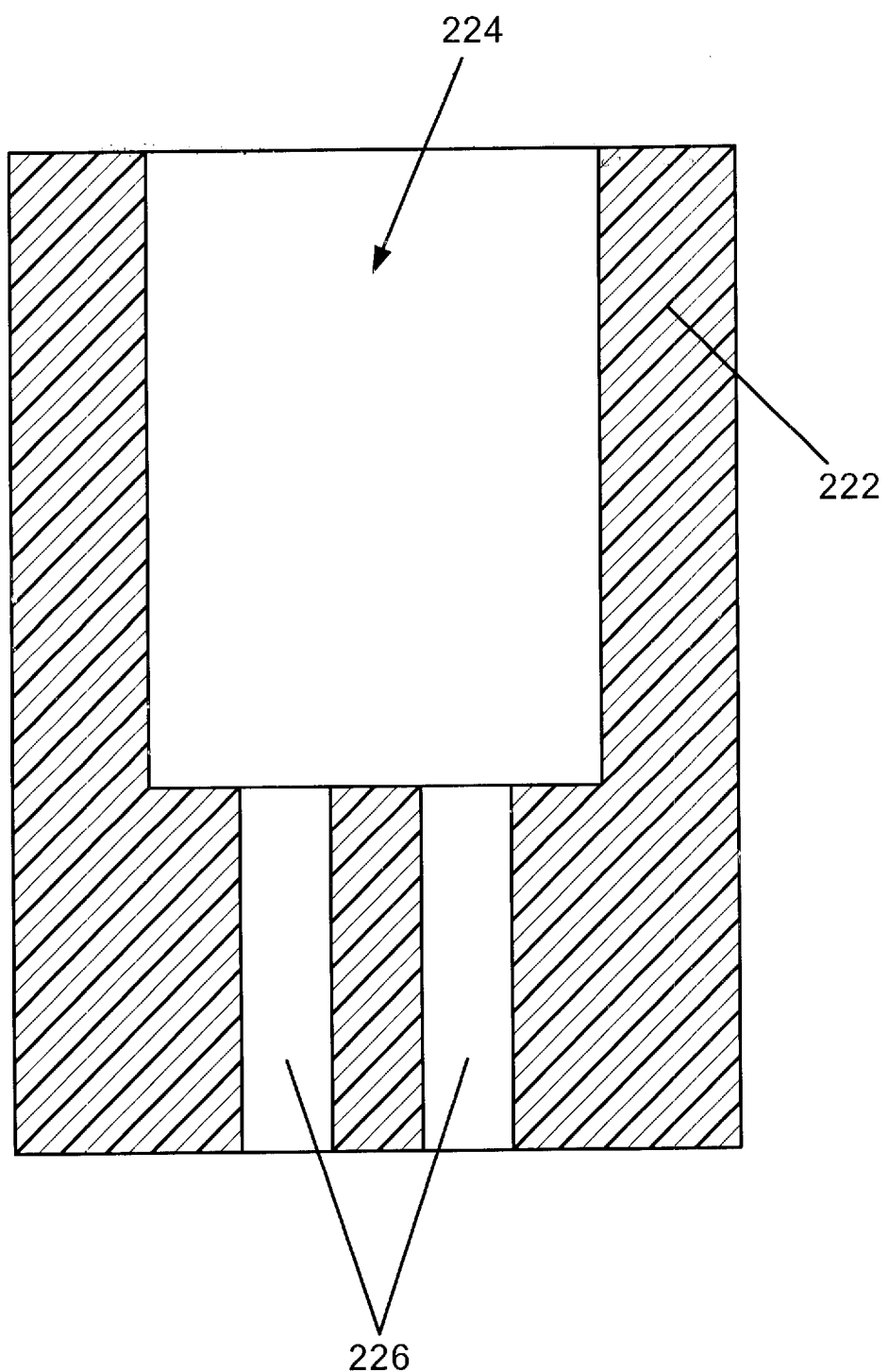
FIG. 15 is a cross-sectional view of an electronic component housing, as known in the art.

Furthermore, as shown in FIGS. 10 and 11, the lid 180 may be configured in a slidable arrangement such that the lid 180 is retained an slides along a slidable attachment mechanism 182. Thus, the lid 180 moves between an open position (see FIG. 10) and a closed position (see FIG. 11). The slidable attachment mechanism 182 may be tongue and groove type mechanisms as shown in FIGS. 12a and 12b. Of course, the slidable attachment mechanism 182 may be any configuration, as will be understood by those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A component retention socket, comprising:
   a housing having a first surface, a second surface, and an attachment surface;
   a recess defined within said housing, wherein said recess comprises a component chamber extending from said housing first surface to a horizontal portion of at least one lead guide channel that extends from said component chamber to said housing second surface;
   said at least one lead guide channel includes at least one sloped wall extending from said component chamber toward said lead guide channel; and
   a lid movably attached to said housing, said lid adapted to move from an open position to a closed position abutting said housing second surface.

2. The component retention socket of claim 1, wherein said at least one lead guide channel includes a vertical portion extending adjacent said second surface from said at least one lead guide channel horizontal portion to said housing attachment surface.

3. The component retention socket of claim 2, wherein said at least one lead guide channel vertical portion comprises a partial channel in said housing second surface and a corresponding partial channel in said lid which together comprise said lead guide channel vertical portion when said lid is in said closed position.

4. The component retention socket of claim 2, further including a structure formed as radius bend between said at least one lead guide channel horizontal portion and said at least one lead guide channel vertical portion.

5. The component retention socket of claim 1, further including at least one substrate attachment mechanism proximate said housing attachment surface.

6. The component retention socket of claim 1, further including a beveled guide proximate said housing first surface tapering into said component chamber.

7. The component retention socket of claim 1, wherein said at least one lead guide channel further comprises a plurality of lead guide channels and further including a lead separator between each of said lead guide channels.

8. A component retention socket, comprising:
   a housing having a first surface, a second surface, and an attachment surface;
   a recess defined within said housing, wherein said recess comprises a component chamber extending from said housing first surface to a horizontal portion of at least one lead guide channel that extends from said component chamber to a vertical portion of said lead guide channel which extends to said housing attachment surface; and said at least one lead guide channel includes at least one sloped wall extending from said component chamber toward said at least one lead guide channel.

9. The component retention socket of claim 8, further including a structure formed as radius bend between said at least one lead guide channel horizontal portion and said at least one lead guide channel vertical portion.

10. The component retention socket of claim 8, further including at least one substrate attachment mechanism proximate said housing attachment surface.

11. The component retention socket of claim 8, further including a beveled guide proximate said housing first surface tapering into said component chamber.

12. The component retention socket of claim 8, wherein said at least one lead guide channel further comprises a plurality of lead guide channels and further including a lead separator between each of said lead guide channels.

13. A method of manufacturing a component retention socket, comprising:

providing a housing having a first surface, a second surface, and an attachment surface; forming a horizontal portion of at least one lead guide channel within said housing extending from said housing second surface;

forming a recess within said housing comprising forming a component chamber extending from said housing first surface to said at least one lead guide channel horizontal portion; and providing a lid movably attached to said housing, said lid adapted to move from an open position to a closed position abutting said housing second surface; and forming at least one sloped wall extending from said component chamber toward said at least one lead guide channel.

14. The method of claim 13, further comprising forming includes a vertical portion of said at least one lead guide channel extending adjacent said second surface from said at least one lead guide channel horizontal portion to said housing attachment surface.

15. The method of claim 14, wherein forming said at least one lead guide channel vertical portion comprises forming a partial channel in said housing second surface and forming a corresponding partial channel in said lid which together comprise said lead guide channel vertical portion when said lid is in said closed position.

16. The method of claim 14, further including forming a structure formed as a radius bend between said at least one lead guide channel horizontal portion and said at least one lead guide channel vertical portion.

17. The method of claim 13, further including forming at least one substrate attachment mechanism proximate said housing attachment surface.

18. The method of claim 13, further including forming a beveled guide proximate said housing first surface tapering into said component chamber.

19. A method of manufacturing a component retention socket, comprising:

providing a housing having a first surface, a second surface, and an attachment surface; forming a horizontal portion of at least one lead guide channel within said housing; forming a vertical portion of said at least one lead guide channel extending from said at least one lead guide channel horizontal portion to said housing attachment surface; and forming a recess within said housing comprising forming a component chamber extending from said housing first surface to said at least one lead guide channel horizontal portion; and forming at least one sloped wall extending from said component chamber toward said at least one lead guide channel.

20. The method of claim 19, further including forming a structure as a radius bend between said at least one lead guide channel horizontal portion and said at least one lead guide channel vertical portion.

21. The method of claim 19, further including forming at least one substrate attachment mechanism proximate said housing attachment surface.

22. The method of claim 19, further including forming a beveled guide proximate said housing first surface tapering into said component chamber.

23. A method comprising:

providing an electronic component having a body and at least one lead;

providing a housing having a first surface, a second surface, an upper surface, and an attachment surface; said housing having a horizontal portion of at least one lead guide channel extending into said housing from said housing second surface, a component chamber extending into said housing from said housing first surface to said at least one lead guide channel horizontal portion, including forming at least one sloped wall extending from said component chamber toward said at least one lead guide channel, a vertical portion of said at least one lead guide channel extending adjacent said second surface from said at least one lead guide channel horizontal portion to said housing attachment surface, and a lid movably attached to said housing upper surface adapted to move from an open position to a closed position abutting said housing second surface;

inserting said electronic component body into said component chamber such that said at least one electronic component lead extends through said at least one lead guide channel horizontal portion; and closing said lid to abut said housing second surface such that said at least one electronic component lead is bent to conform to said at least one lead guide channel vertical portion.

24. The method of claim 23, wherein providing said housing comprises providing said housing having said at least one lead channel vertical portion comprising a channel in said housing second surface and a corresponding channel in said lid.

25. The method of claim 23, wherein providing said housing comprises providing said housing having a structure formed as a radius bend between said at least one lead guide channel horizontal portion and said at least one lead guide channel vertical portion.

* * * * *

UNITED STATES PATENT AND TRADEMARK OFFICE
CERTIFICATE OF CORRECTION

PATENT NO. : 6,555,746 B2
DATED : April 29, 2003
INVENTOR(S) : Boyd et al.

It is certified that error appears in the above-identified patent and that said Letters Patent is hereby corrected as shown below:

Column 2,
Line 28, delete "aside", insert -- a side --.

Signed and Sealed this

Fifteenth Day of July, 2003

JAMES E. ROGAN
*Director of the United States Patent and Trademark Office*